United States Patent
Kang et al.

(10) Patent No.: US 8,042,020 B2
(45) Date of Patent: Oct. 18, 2011

(54) DATA ERROR CORRECTION CIRCUIT, INTEGRATED CIRCUIT FOR DATA ERROR CORRECTION, AND METHOD OF PERFORMING DATA ERROR CORRECTION

(75) Inventors: Won-Sik Kang, Seoul (KR); Seong-Cheol Kim, Seoul (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 1030 days.

(21) Appl. No.: 11/772,985

(22) Filed: Jul. 3, 2007

(65) Prior Publication Data
US 2008/0001965 A1    Jan. 3, 2008

(30) Foreign Application Priority Data
Jul. 3, 2006   (KR) .................. 10-2006-0062100

(51) Int. Cl.
*G11C 29/00*   (2006.01)
(52) U.S. Cl. .................. 714/763; 714/752; 714/758
(58) Field of Classification Search .................. 714/758, 714/763
See application file for complete search history.

(56) References Cited

U.S. PATENT DOCUMENTS
| | | | | |
|---|---|---|---|---|
| 4,447,903 | A | * | 5/1984 | Sewerinson ................. 714/821 |
| 4,604,747 | A | * | 8/1986 | Onishi et al. ................. 714/755 |
| 4,697,265 | A | * | 9/1987 | Nozue ........................... 714/705 |
| 4,794,626 | A | * | 12/1988 | Tanabe et al. ................. 375/368 |
| 2003/0217320 | A1 | * | 11/2003 | Gorshe .......................... 714/758 |

FOREIGN PATENT DOCUMENTS
| | | |
|---|---|---|
| JP | 2003-263134 | 9/2003 |
| JP | 2005-182080 | 7/2005 |
| KR | 1020040006767 | 1/2004 |
| KR | 1020050122501 | 12/2005 |

\* cited by examiner

*Primary Examiner* — Sam Rizk
(74) *Attorney, Agent, or Firm* — F. Chau & Associates, LLC (57) ABSTRACT

A data error correction circuit includes a plurality of one-bit registers, a data error detection unit and a data error correction unit. The data error detection unit detects whether all the data values stored in the plurality of the registers are equal. The data correction unit determines a correct data value based upon each of the stored data values, and corrects each of the data values into the determined correct data value if the data values are not equal. Therefore, the data error correction circuit may correct a data error due to electrostatic discharge (ESD) or electromagnetic interference (EMI).

19 Claims, 8 Drawing Sheets

DATA ERROR CORRECTION CIRCUIT, INTEGRATED CIRCUIT FOR DATA ERROR CORRECTION, AND METHOD OF PERFORMING DATA ERROR CORRECTION

CROSS-REFERENCE TO RELATED APPLICATIONS

This application claims priority, under 35 USC §119, of Korean Patent Application No. 2006-62100, filed on Jul. 3, 2006 in the Korean Intellectual Property Office (KIPO), which is incorporated by reference herein in its entirety.

BACKGROUND OF THE INVENTION

1. Field of the Invention

The present invention relates to data error correction, and more particularly to a data error correction circuit, an integrated circuit (IC) for data error correction, and a method of data error correction capable of correcting data errors caused by electrostatic discharge (ESD) or electromagnetic interference (EMI).

2. Description of the Related Art

As digital electronic devices such as liquid crystal display (LCD) devices, digital televisions (TV), and mobile communication devices have become more popular, memory devices have become more important for the digital devices for storing status and user information or supporting various functions. These memory devices may include registers and random-access memory (RAM).

However, a data value stored in a memory device such as a one-bit register may be damaged due to various causes. For example, the causes of data damage may include static electricity generated by a user's touch, electromagnetic interference (EMI) due to operation of the digital device, and electrostatic discharge (ESD).

Figure 1:
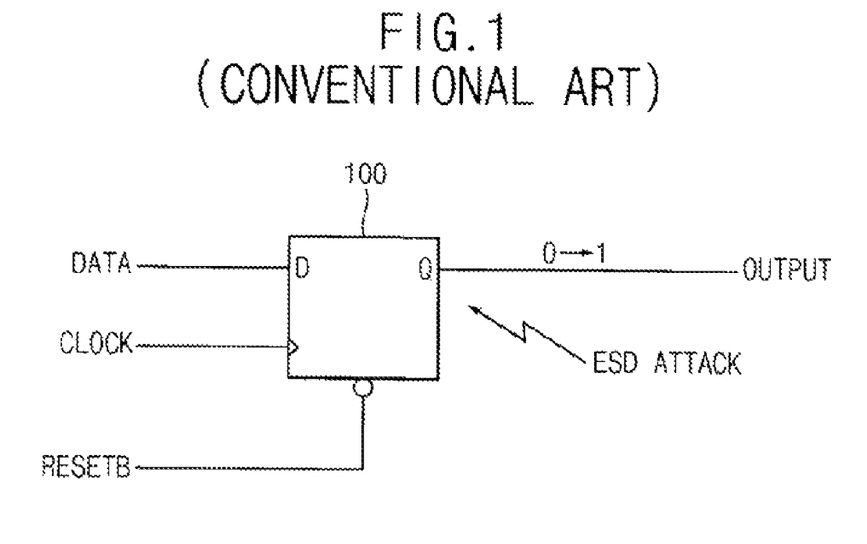
FIG. 1 is a circuit diagram of a conventional storage register for illustrating how a data value stored in the register may be damaged by electromagnetic interference (EMI) or electrostatic discharge (ESD)

FIG. 1 is a diagram for illustrating how a data value stored in a register (flip-flop) may be damaged due to EMI or ESD.

In FIG. 1, an original data value stored in a register ("D" flip flop) 100 corresponds to a value of '0', but the stored data value may be changed into a to value of '1' due to EMI or ESD. Therefore, the register 100 may store and/or output an incorrect data value of '1'.

SUMMARY OF THE INVENTION

Various aspects of the present invention provide a data error correction circuit capable of correcting data errors generated by electrostatic discharge (ESD) or by electromagnetic interference (EMI).

Other aspects of the present invention provide an integrated circuit (IC) capable of correcting data errors generated by ESD or EMI.

Still other aspects of the present invention provide a method of data error correction capable of correcting data errors generated by ESD or EMI.

In some embodiments of the present invention, a data error correction circuit includes a plurality of registers, a data error detection unit configured to detect whether data values respectively stored in the plurality of the registers are equal to each other, and a data correction unit configured to determine a correct data value based upon each of the data values, and configured to correct each of the data values into the determined data value if the data values are not equal.

The data error detection unit may detect whether the data values are equal to each other, based upon a logical AND value of the data values and a logical AND value of inverted data values, in which the inverted data values are obtained by inverting the data values.

The data error detection unit may include a first AND-gate configured to perform a logical AND operation upon the data values, a second AND-gate to configured to perform a logical AND operation upon the inverted data values, and an OR-gate configured to perform a logical OR operation upon the output value of the first AND-gate and the output value of the second AND-gate.

The data correction unit may include a correct value determination unit configured to calculate the correct data value based upon the data values, and a correct value selection unit configured to select one of the calculated data value and an external data value based upon the detected result of the data error detection unit.

For example, the correct data value may correspond to one of a logical AND value of the data values and a logical OR value of the data values.

The correct value determination unit may include a logical OR-gate for performing a logical OR operation upon the data values, may include a logical AND-gate for performing a logical AND operation upon the data values, or may include a logical OR-gate configured to perform a logical OR operation upon the data values, a logical AND-gate configured to perform a logical AND operation upon the data values, and a selection circuit configured to select one of the output value of the local OR-gate and the output value of the logical AND-gate.

The selection circuit may select one of the output value of the local OR-gate and the output value of the logical AND-gate based upon an event signal received from the exterior.

The correct value selection unit may input the calculated data value to the plurality of the registers if the data values are not equal, and may input the external data value to the plurality of the registers if the data values are equal.

The correct value selection unit may include a clock selector configured to to provide (select) a clock for indicating a time point when the calculated data value is stored if the data values are not equal, and a correct data providing unit configured to provide the calculated data if the data values are not equal.

In other embodiments of the present invention, an IC for data error correction includes an event detection circuit configured to detect an event generated from the exterior and a data error correction circuit configured to correct the data error based upon the detected event. The data error correction circuit includes a plurality of registers, a data error detection unit configured to detect whether data values respectively stored in the plurality of the registers are equal to each other, and a data correction unit configured to determine a correct data value based upon the detected event and each of the data values, and configured to correct each of the data values into the determined correct data value if the data values are not equal.

The data error detection unit may detect whether the data values are equal to each other, based upon the result of a logical AND operation performed upon the data values and the result of a logical AND operation performed upon inverted data values, in which the inverted data values are obtained by inverting the data values.

The data correction unit may include a correct value determination unit configured to calculate the correct data value based upon the data values, and a correct value selection unit configured to select one of the calculated correct data value and an external data value based upon the detected event and the detected result of the data error detection unit.

The correct value selection unit may select one of the result of a logical AND operation performed upon the data values and the result of a logical OR operation performed upon the data values based upon the detected event.

In still other embodiments of the present invention, a method of data error correction includes detecting whether all data values stored in a plurality of one-bit registers are equal to each other, determining a correct data value based upon each of the data values, and correcting each of the data values into the determined correct data value if the data values are not equal.

Accordingly a data error due to ESD or EMI may be corrected by using a plurality of registers.

Embodiments of the present invention now will be described more fully with reference to the accompanying drawings, in which embodiments of the invention are shown. The present invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

The present invention now will be described more fully hereinafter with reference to the accompanying figures, in which embodiments of the invention are shown. However, it should be understood that there is no intent to limit the invention to the particular forms disclosed, but on the contrary, the invention is to cover all modifications, equivalents, and alternatives falling within the spirit and scope of the invention as defined by the claims.

BRIEF DESCRIPTION OF THE DRAWINGS

The above and other features of the present invention will become more apparent to persons skilled in the art by describing in detail exemplary embodiments thereof with reference to the attached drawings in which.

DETAILED DESCRIPTION OF EXEMPLARY EMBODIMENTS OF THE INVENTION

Figure 2:
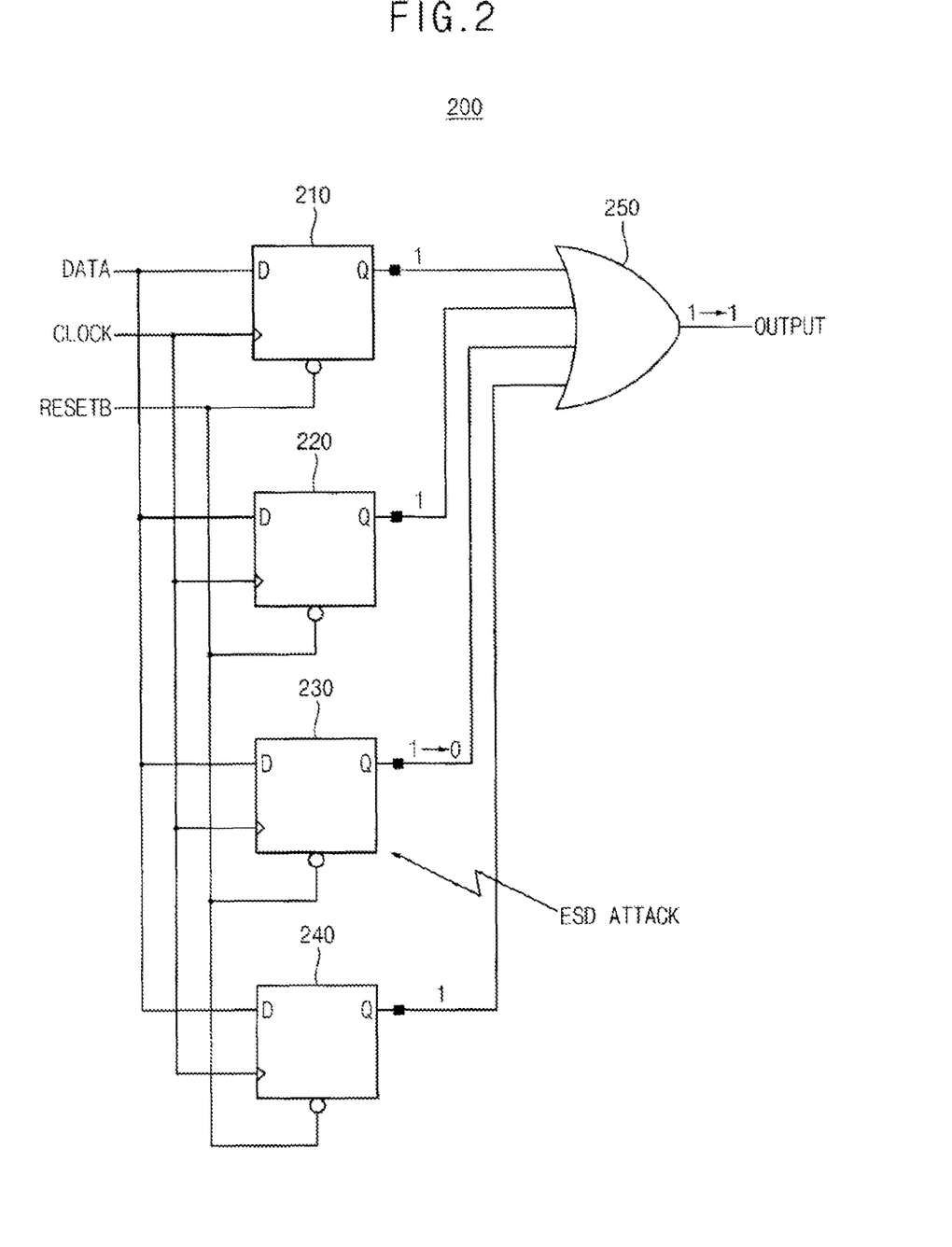
FIG. 2 is a circuit diagram illustrating a configuration that maintains its output value as a logic high unless all data values correspond to a logic low.

FIG. 2 is a circuit diagram of a circuit according to an embodiment of the invention, that maintains its output at a logic high value unless all data values correspond to a logic low.

Referring to FIG. 2, the circuit 200 includes a first register 210, a second register 220, a third register 230, a fourth register 240 and a logical OR-gate 250.

The first through fourth registers 210 through 240 may be memory devices (e.g. D flip-flops, as shown) respectively storing the same (an equal) data value.

The OR-gate 250 performs a logical OR operation upon the outputs of the first through the fourth registers 210 through 240.

The circuit 200 is useful by itself when each of the data values of the first through the fourth registers 210 through 240 is expected as a logic high according to a specific event received from the interior or exterior or when each of the data values of the first through the fourth registers 210 through 240 is expected as a logic high according to the laws of probability.

For example, assuming that each of the data values of the first through the fourth registers 210 through 240 corresponds to a logic high, the circuit may maintain its output value as a logic high although a data value in the third register 230 is changed into a logic low due to electrostatic discharge (ESD) or electromagnetic interference (EMI).

Figure 3:
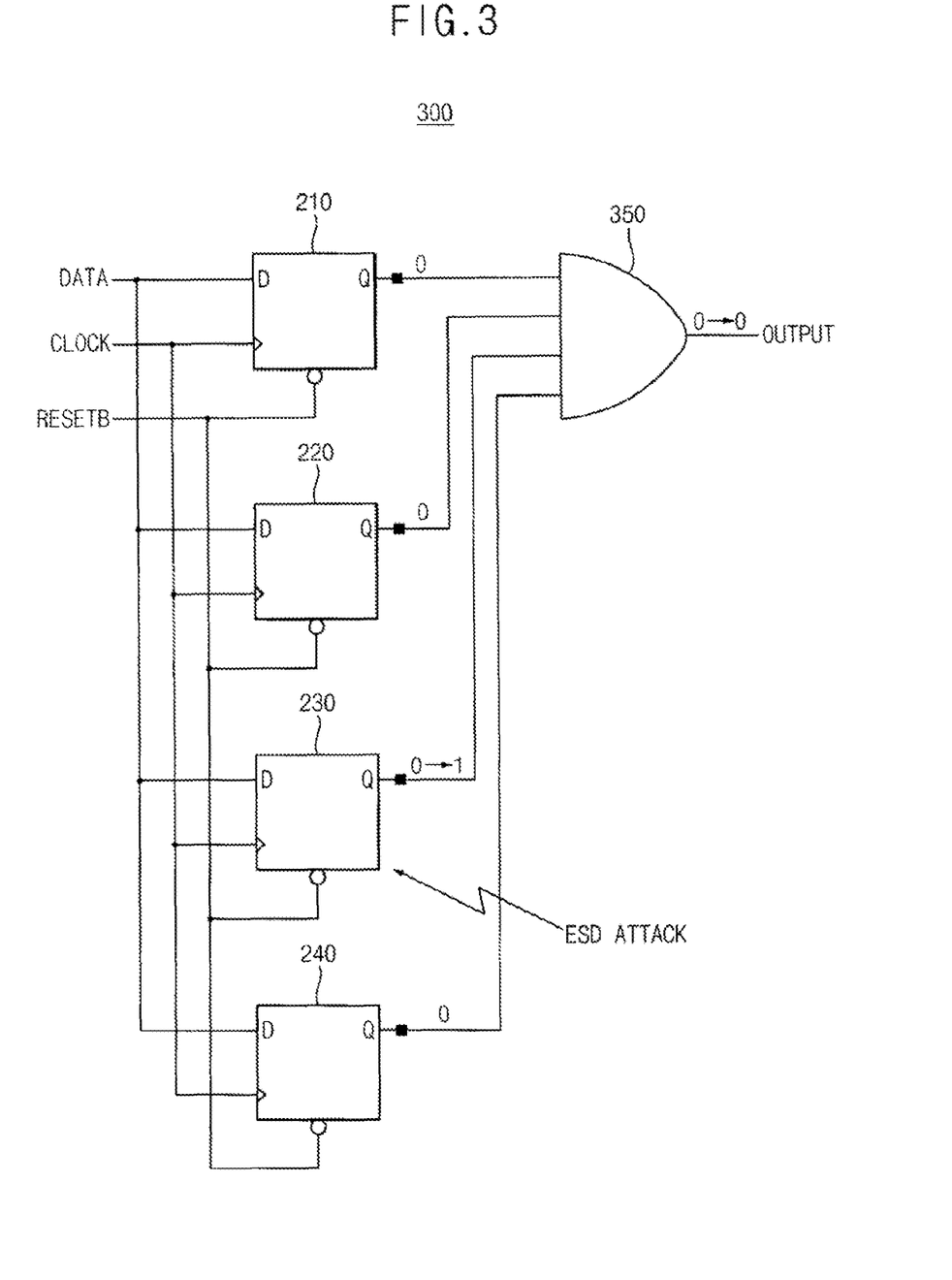
FIG. 3 is a circuit diagram of a circuit, according to an exemplary embodiment of the invention, that maintains its output value as a logic low unless all data values correspond to a logic high.

FIG. 3 is a circuit diagram of a circuit, according to an embodiment of the invention, that maintains its output value as a logic low unless all data values correspond to a logic high.

Referring to FIG. 3, the circuit 300 includes a first register 210, a second register 220, a third register 230, a fourth register 240 and a logical AND-gate 350.

The first through fourth registers 210 through 240 may be memory devices (e.g., D flip-flops, as shown) respectively storing the same (an equal) data value.

The AND-gate 350 performs a logical AND operation upon outputs of the first through the fourth registers 210 through 240.

The circuit 300 is useful when each of the data values of the first through the fourth registers 210 through 240 is expected as a logic low according to a specific event received from the interior or exterior or when each of the data values of the first through the fourth registers 210 through 240 is expected as a logic low according to the laws of probability.

For example assuming that each of the data values of the first through fourth registers 210 through 240 corresponds to a logic low, the circuit 300 may maintain its output value as a logic low although a data value in the third register 230 is changed to a logic high due to the ESD or EMI.

Figure 4:
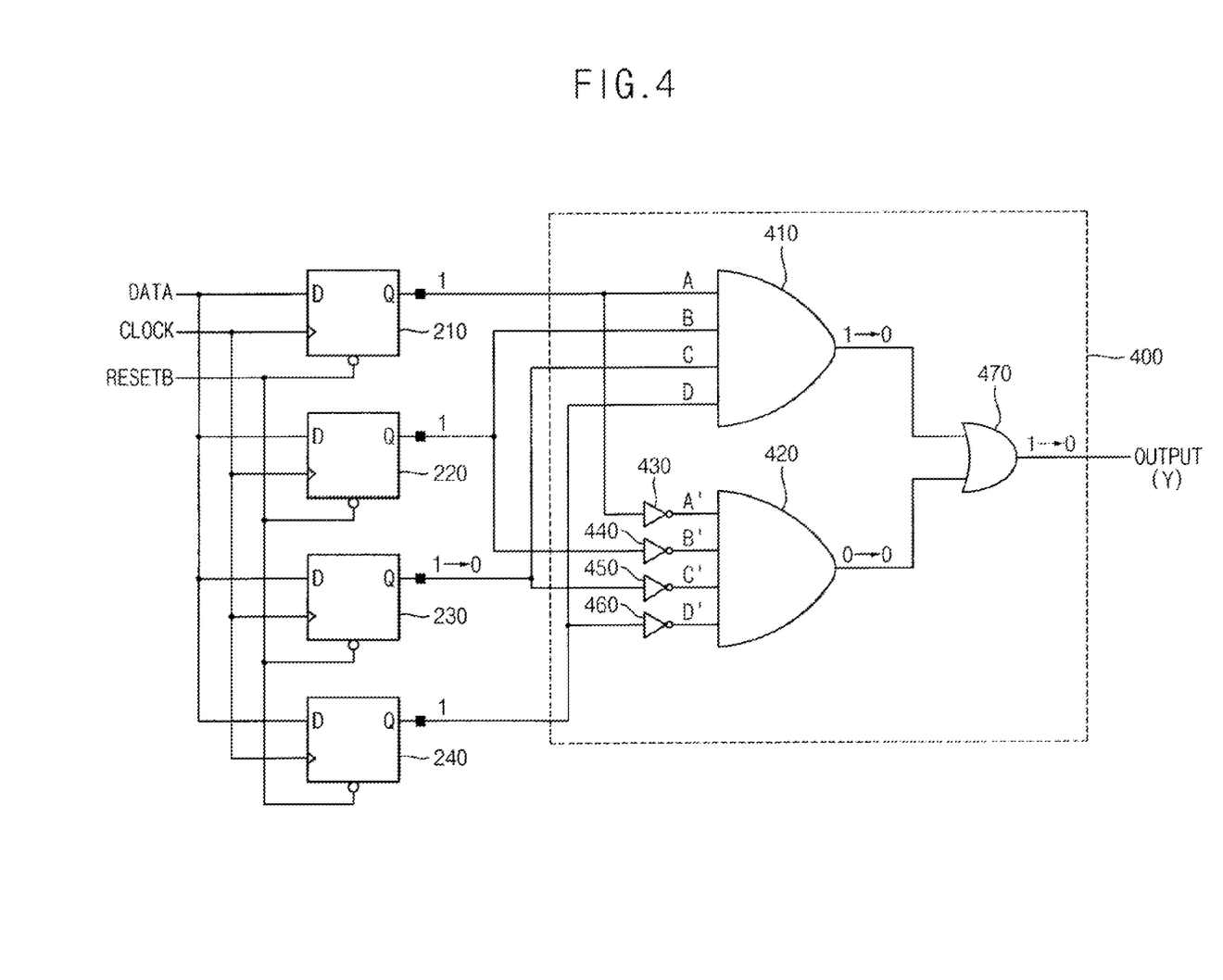
FIG. 4 is a circuit diagram of a data error detection unit, according to an exemplary embodiment of the invention, that detects whether data values stored in registers are equal to each other.

FIG. 4 is a circuit diagram of a data error detection unit, according to an embodiment of the invention, that detects whether data values stored in the first through fourth registers 210 through 240 are equal to each other.

Referring to FIG. 4, a data error detection unit 400 includes first through fourth registers 210 through 240, first and second logical AND-gates 410 and 420, first through fourth inverters 430 through 460, and a logical OR-gate 470.

The first through fourth registers 210 through 240 may be memory devices (e.g., D flip-flops, as shown) respectively for storing an equal data value.

The first through fourth inverters 430 through 460 respectively invert values of the first through fourth registers 210 through 240.

The first logical AND-gate 410 performs a logical AND operation upon the first through fourth registers 210 through 240, and the second logical AND-gate 420 performs a logical AND operation upon the inverted values of the first through fourth registers 210 through 240.

The logical OR-gate 470 performs a logical OR operation upon the output of the first logical AND-gate 410 and the output of the second logical AND-gate 420.

As a result, the output of the data error detection unit 400 satisfies the following Boolean Equation 1.

$$Y=(A \cdot B \cdot C \cdot D)+(\dot{A} \cdot \dot{B} \cdot \dot{C} \cdot \dot{D}) \qquad \text{[Equation 1]}$$

($A \cdot B \cdot C \cdot D$ respectively indicate ANDed values of the first through fourth registers 210 through 240, and $\dot{A} \cdot \dot{B} \cdot \dot{C} \cdot \dot{D}$ respectively indicate ANDed inverted values of the first through fourth registers 210 through 240.)

The data error detection unit 400 detects whether each of data values stored in the first through fourth registers 210 through 240 is equal. For example, assuming that each of the data values of the first through fourth registers 210 through 240 corresponds to a logic high and a data value of one register (e.g., the third register 230) is changed due to the ESD or EMI, the data error detection unit 400 changes the logic level of its OUTPUT (Y). Thus, the data error detection unit 400 changes its OUTPUT (Y) from a logic high to a logic low according to Boolean Equation 1.

Figure 5:
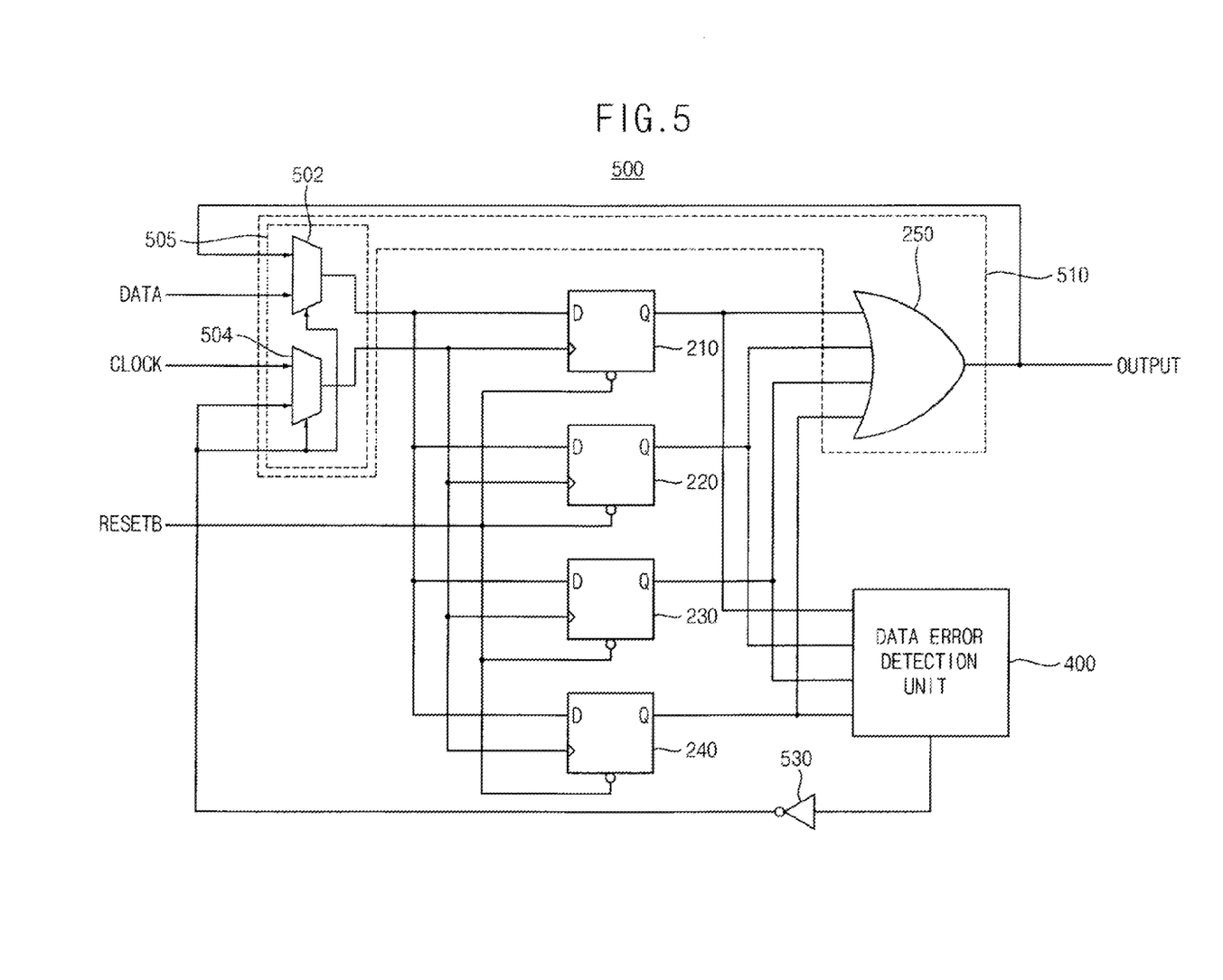
FIG. 5 is a circuit diagram of a data error correction circuit according to an exemplary embodiment of the present invention.

FIG. 5 is a circuit diagram of a data error correction circuit according to an exemplary embodiment of the present invention.

Referring to FIG. 5, a data error correction circuit 500 includes first through fourth registers 210 through 240, a data error detection unit 400, a data correction unit 510 and an inverter 530.

The data error correction circuit 500 is useful when each of the data values of the first through the fourth registers 210 through 240 is expected as a logic high according to a specific event received from the interior or exterior or when each of the data values of the first through the fourth registers 210 through 240 is expected as a logic high according to the laws of probability.

The first through fourth registers 210 through 240 may be memory devices respectively storing the same (an equal) data value.

The data error detection unit 400 detects whether data values stored in the first through fourth registers 210 through 240 are equal to each other, and the inverter 530 inverts the output of the data error detection unit 400.

The data correction unit 510 includes a correct value selection unit 505 and a correct value determination unit 250, and the correct value selection unit 505 includes a correct value selector 502 and a clock selector 504.

The correct value determination unit 250 performs a logical OR operation upon data values in the first through fourth registers 210 through 240.

The correct value selector 502 selects one of an external data value and the output value of the correct value determination unit 250 based upon the output of the data error detection unit 400.

The clock selector 504 provides a clock for indicating a time point when each of the first through fourth registers 210 through 240 stores the selected data. Thus, the clock selector 504 selects one of a clock received from the exterior and the output of the data error detection unit 400 as a clock, and indicates a time point when the selected data is reliably stored in the first through fourth registers 210 through 240.

The operation of the data error correction circuit 500 will now be described.

The correct value determination unit 250 performs a logical OR operation upon data values in the first through fourth registers 210 through 240, and the to correct value selection unit 505 selects one of the output of the correct value determination unit 250 and an external data value based upon the output (Y) of the data error detection unit 400.

The data error detection unit 400 (see FIG. 4) detects whether data values stored in the first through fourth registers 210 through 240 are equal to each other. For example, assuming that each of the data values of the first through the fourth registers 210 through 240 corresponds to a logic high, the data error detection unit 400 outputs a logic low when any (e.g., the third register 230 is changed due to the ESD or EMI, and outputs a logic high when the data values in the first through fourth registers are equal.

The inverter 530 inverts the output (Y) of the data error detection unit 400 to output a logic high when the data values of the first through the fourth registers 210 through 240 are not equal and to output a logic low when the data values of the first through the fourth registers 210 through 240 are equal.

The correct value selector 502 selects the output value of the correct value determination unit 250 when the data values of the first through the fourth registers 210 through 240 are not equal, to provide the selected value, and the clock selector 504 provides a clock signal based upon the output of the data error detection unit 400.

Thus, the clock selector 504 provides a clock for indicating a time point when each of the first through fourth registers 210 through 240 stores the selected data, and the correct value selector 502 selects the data value for storing the selected data value into each of the first through fourth registers 210 through 240.

Therefore, the data error correction circuit 500 may perform a logical OR operation upon data values in the first through fourth registers 210 through 240 to determine a correct data value, and may store the correct data value into the first through fourth registers 210 through 240.

Figure 6:
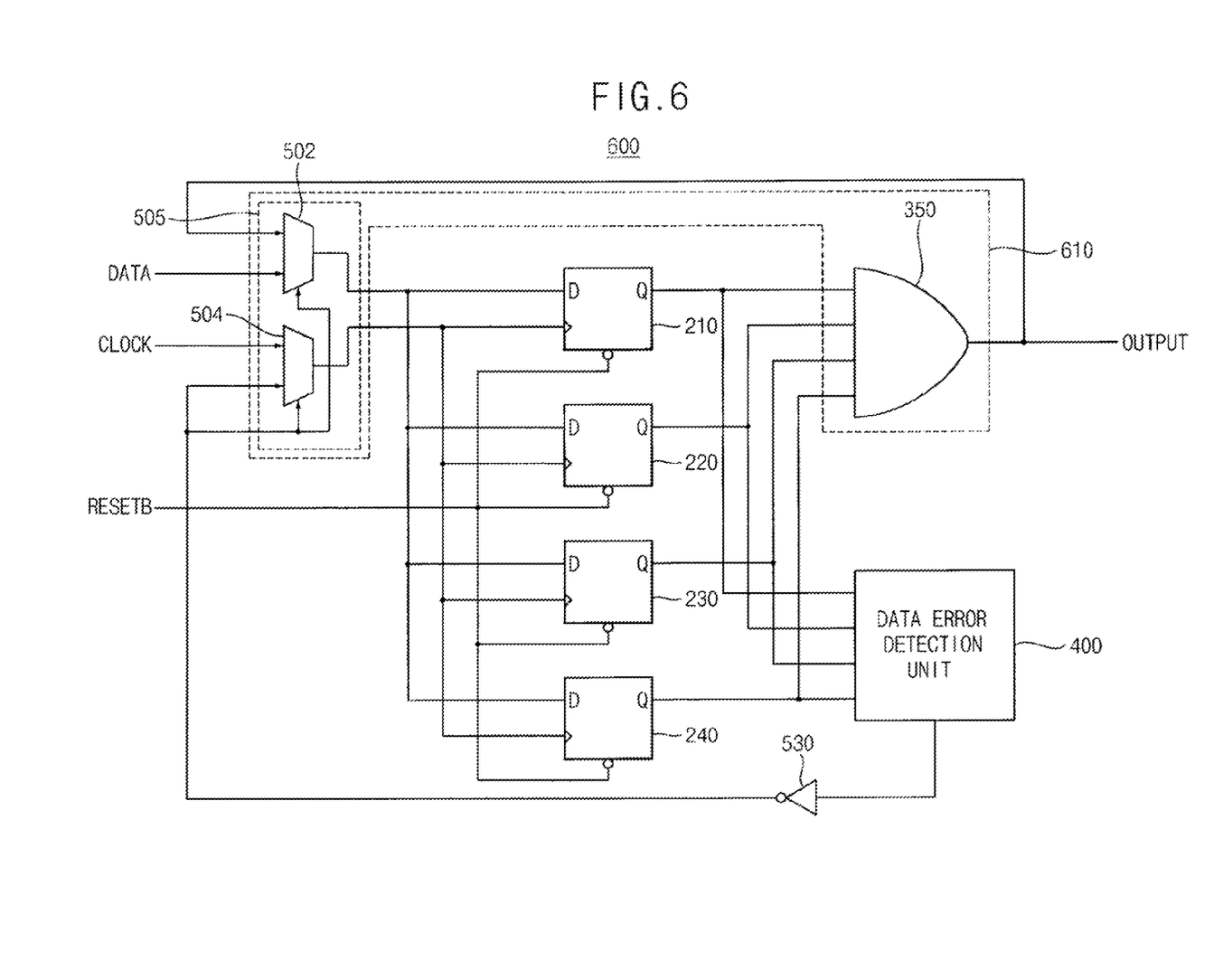
FIG. 6 is a circuit diagram of a data error correction circuit according to another exemplary embodiment of the present invention.

FIG. 6 is a circuit diagram illustrating a data error correction circuit 600 according to another example embodiment of the present invention.

Referring to FIG. 6, a data error correction circuit 600 includes first through fourth registers 210 through 240, a data error detection unit 400, a data correction unit 610 and an inverter 530.

The data error correction circuit 600 is useful when each of the data values of the first through the fourth registers 210 through 240 is expected as a logic low according to a specific event received from the interior or exterior or when each of the data values of the first through the fourth registers 210 through 240 is expected as a logic low according to the laws of probability.

The first through fourth registers 210 through 240 may be memory devices (e.g., D flip-flops, as shown) respectively storing the same (an equal) data value.

The data error detection unit 400 detects whether each of data values stored in the first through fourth registers 210 through 240 is equal, and the inverter 530 inverts the output (Y) of the data error detection unit 400.

The data correction unit 610 includes a correct value selection unit 505 and a correct value determination unit 350, and the correct value selection unit 505 includes a correct value selector 502 and a clock selector 504.

The correct value determination unit 350 performs a logical AND operation to upon data values in the first through fourth registers 210 through 240.

The correct value selector 502 selects one of an external data value and the output value of the correct value determination unit 350 based upon the output of the data error detection unit 400. Thus, the correct value selector 502 selects the output value of the correct value determination unit 350 when each of the data values of the first through fourth registers 210 through 240 is not equal.

The clock selector 504 provides a clock for indicating a time point when each of the first through fourth registers 210 through 240 stores the selected data. Thus, the clock selector 504 selects one of a clock received from the exterior and the output of the data error detection unit 400 as a clock, and indicates a time point when the selected data is stored in the first through fourth registers 210 through 240.

The operation of the data error correction circuit 600 will now be described.

The correct value determination unit 350 performs a logical AND operation upon data values in the first through fourth registers 210 through 240, and the correct value selection unit 505 selects one of the output of the correct value determination unit 350 and an external data value based upon the output of the data error detection unit 400.

The data error detection unit 400 detects whether data values stored in the first through fourth registers 210 through 240 are equal to each other. For example, assuming that each of the data values of the first through the fourth registers 210 through 240 corresponds to a logic low, the data error detection unit 400 outputs a logic low when the third register 230 is changed due to the ESD or EMI, and outputs a logic high when the data values in the first through fourth to registers are equal.

The inverter 530 inverts the output of the data error detection unit 400 to output a logic high when the data values of the first through the fourth registers 210 through 240 are not equal and to output a logic low when the data values of the first through the fourth registers 210 through 240 are equal.

The correct value selector 502 selects the output value of the correct value determination unit 350 when the data values of the first through the fourth registers 210 through 240 are not equal to provide the selected value, and the clock selector 504 provides a clock signal based upon the output of the data error detection unit 400.

Thus, the clock selector 504 provides a clock for indicating a time point when each of the first through fourth registers 210 through 240 stores the selected data, and the correct value selector 502 selects the data value for storing the selected data value into each of the first through fourth registers 210 through 240.

Therefore, the data error correction circuit 600 performs a logical AND operation upon data values in the first through fourth registers 210 through 240 to determine a correct data value, and may store the correct data value into the first through fourth registers 210 through 240.

Figure 7:
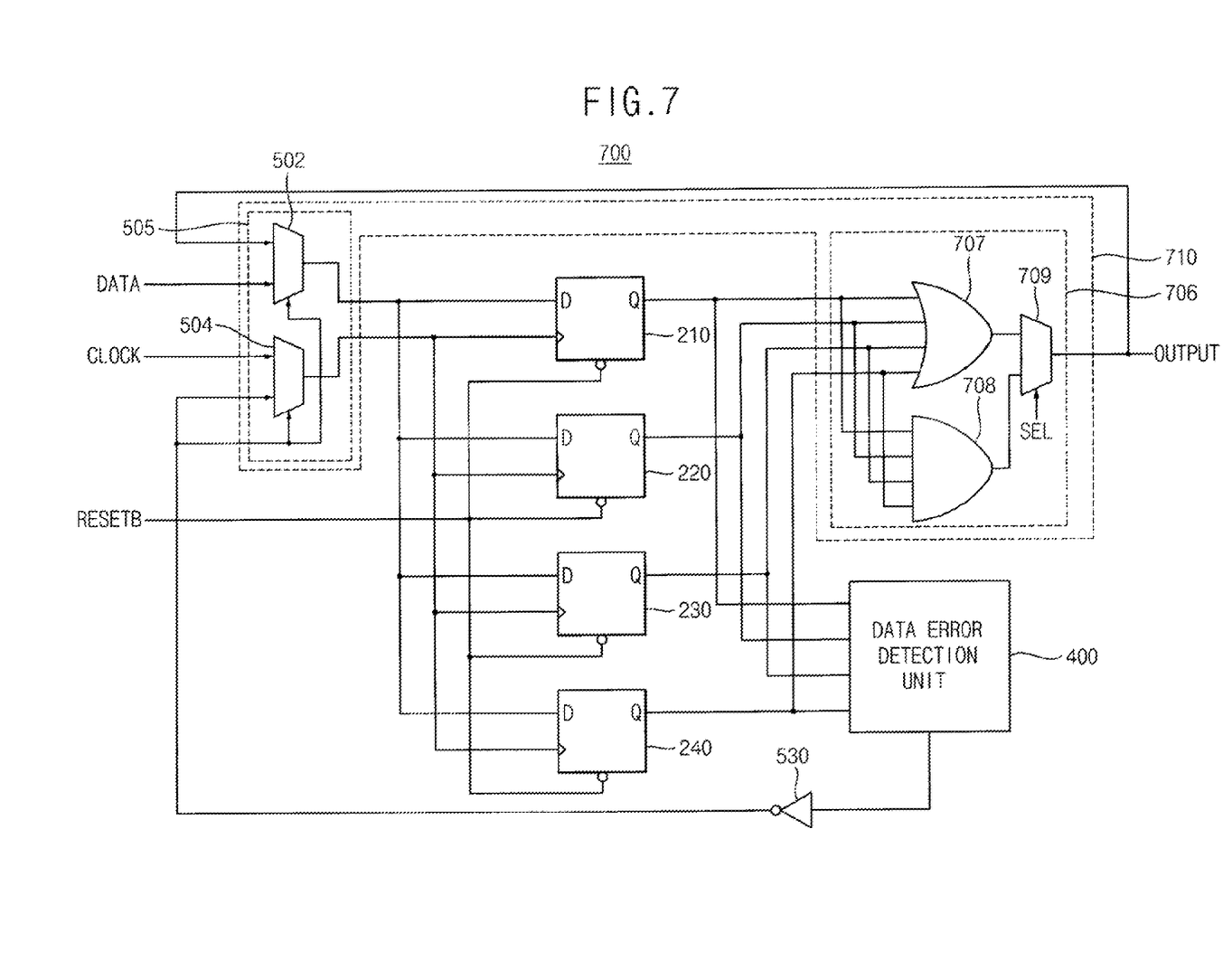
FIG. 7 is a circuit diagram of a data error correction circuit according to still another exemplary embodiment of the present invention.

FIG. 7 is a circuit diagram of a data error correction circuit 700 according to still another example embodiment of the present invention.

Referring to FIG. 7, a data error correction circuit 700 includes first through fourth registers 210 through 240, a data error detection unit 400, a data correction unit 710 and an inverter 530.

The data error correction circuit 700 is useful when all of the data values of the first through the fourth registers 210 through 240 is expected to be a logic high or all a logic low according to a specific event received from the interior or exterior or when each of the data values of the first through the fourth registers 210 through 240 is expected as a logic high or logic low according to the laws of probability.

The first through fourth registers 210 through 240 may be memory devices (e., D flip-flops, as shown) respectively storing the same (an equal) data value.

The data error detection unit 400 detects whether data values stored in the first through fourth registers 210 through 240 are equal to each other, and the inverter 530 inverts the output of the data error detection unit 400.

The data correction unit 710 includes a correct value selection unit 505 and a correct value determination unit 706. The correct value selection unit 505 includes a correct value selector 502 and a clock selector 504. The correct value determination unit 706 includes an OR-gate 707, an AND-gate 708 and a multiplexer 709.

The correct value determination unit 710 performs a logical AND operation or a logical OR operation upon data values stored in the first through fourth registers 210 through 240, and selects the logical AND operation result and the logical OR operation result, based upon a specified event signal received from the exterior.

The correct value selector 502 selects one of an external data value and the output value of the correct value determination unit 350 based upon the to output of the data error detection unit 400. Thus, the correct value selector 502 selects the output value of the correct value determination unit 710 when the data values of the first through fourth registers 210 through 240 are not equal.

The clock selector 504 provides a clock for indicating a time point when each of the first through fourth registers 210 through 240 stores the selected data. Thus, the clock selector 504 selects one of a clock received from the exterior and the output of the data error detection unit 400 as a clock, and indicates a time point when the selected data is reliably stored in the first through fourth registers 210 through 240.

The operation of the data error correction circuit 700 will now be described.

The correct value determination unit 706 performs a logical AND operation or a logical AND operation upon data values in the first through fourth registers 210 through 240, and the correct value selection unit 505 selects one of the output of the correct value determination unit 706 and an external data value based upon the output of the data error detection unit 400.

The data error detection unit 400 detects whether data values stored in the first through fourth registers 210 through 240 are equal to each other. For example, assuming that each of the data values of the first through the fourth registers 210 through 240 corresponds to a logic high, the data error detection unit 400 outputs a logic low when the third register 230 is changed due to the ESD or EMI, and outputs a logic high when each of the data values in the first through fourth registers is equal. For another example, assuming that each of the data values of the first through the fourth registers 210 through 240 corresponds to a logic low, the data error detection unit 400 outputs a logic low when the any register (e.g., the third register 230) is changed due to the ESD or EMI, and outputs a logic high when all of the data values in the first through fourth registers are equal.

The inverter 530 inverts the output of the data error detection unit 400 to output a logic high when the data values of the first through the fourth registers 210 through 240 are not equal and to output a logic low when the data values of the first through the fourth registers 210 through 240 are equal.

The correct value selector 502 selects the output value of the correct value determination unit 706 when the data values of the first through the fourth registers 210 through 240 are not equal to provide the selected value, and the clock selector 504 provides a clock signal based upon the output of the data error detection unit 400.

Thus, the clock selector 504 provides a clock for indicating a time point when each of the first through fourth registers 210 through 240 stores the selected data, and the correct value selector 502 selects the data value for storing the selected data value into each of the first through fourth registers 210 through 240.

Therefore, the data error correction circuit 700 may perform a logical OR operation or a logical AND operation upon data values in the first through fourth registers 210 through 240 to determine a correct data value and may store the correct data value into the first through fourth registers 210 through 240.

Figure 8:
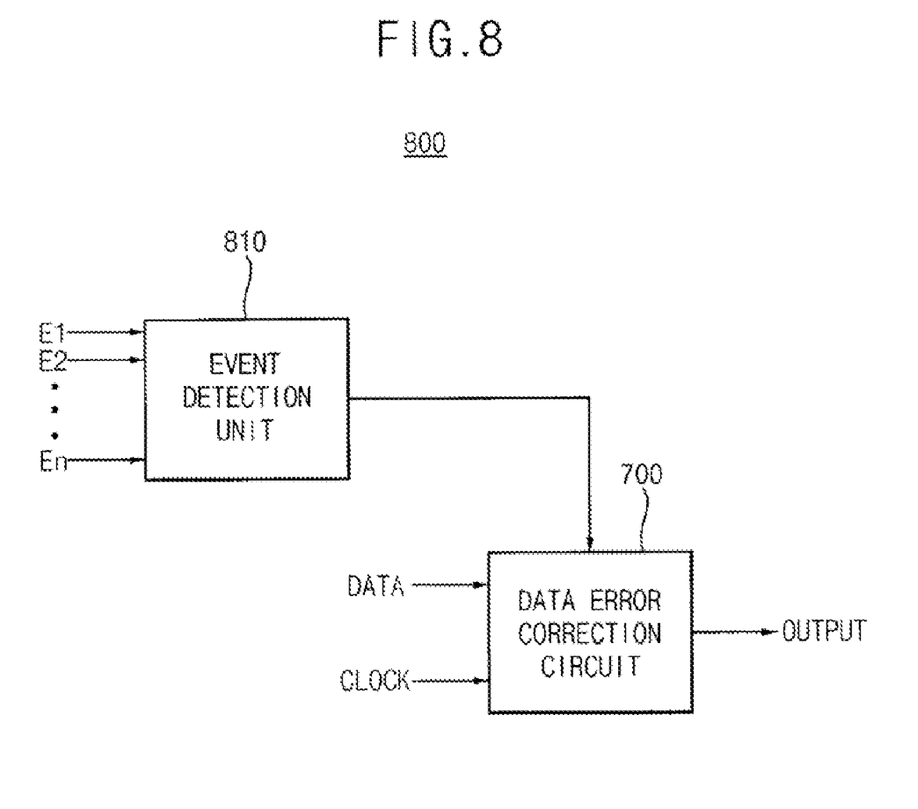
FIG. 8 is a block diagram illustrating an integrated circuit (IC) including the data error collection circuit 700 of FIG. 7, for correcting data errors based upon an event signal.

FIG. 8 is a block diagram illustrating an integrated circuit (IC), including the data error correction unit 700, for correcting data errors based upon an event signal according to an exemplary embodiment of the present invention.

Referring to FIG. 8, the IC 800 includes an event detection unit 810 and the data error correction circuit 700 of FIG. 7.

The event detection unit 810 detects an event received from the exterior. For example, a mobile communication device such as a cellular phone may activate a liquid crystal display (LCD) device (or other means for displaying an image) when a user opens the hinge of a "clamshell" type cellphone or presses a button of the cellular phone to use the cellular phone. A specific event may be determined according to a user action (e.g., user's opening of the phone).

The data error correction circuit may correct a data error upon the occurrence of the specific event and may correspond to the data error correction circuit 700 in FIG. 7

As described above, a data error correction circuit according to above example embodiments of the present invention may correct a data error due to ESD or EMI by using a plurality of (redundant) registers.

While the exemplary embodiments of the present invention have been described in detail, it should be understood that various changes, substitutions and alterations may be made herein without departing from the scope of the invention.

What is claimed is:

1. A data error correction circuit, comprising:
a plurality of one-bit registers;
a data error detection unit configured to detect whether all data values respectively stored in the plurality of the registers are equal to each other; and
a data correction unit configured to determine correct data values based upon each of the stored data values, and configured to store the correct data values into the registers, respectively, if the data values are not equal,
wherein the data error detection circuit comprises:
a first AND-gate receiving all bits output by the one-bit registers;
a plurality of inverters receiving the all bits, wherein each inverter receives a corresponding one of the all bits to generate inverted bits;
a second AND-gate, all inputs of the second AND-gate receiving the inverted bits from the inverters; and
an OR-gate receiving an output of the first AND-gate and an output of the second AND-gate,
wherein an output of the OR-gate is a first logical value when all of the bits output by the one-bit registers are the same and a second and different logical value otherwise,
wherein the data correction unit comprises:
a logic gate receiving all bits output by the one-bit registers as inputs to output a value;
a first selection unit receiving the value as a first input, an external data value as a second input, and a first selection signal based on the output of the OR-gate, wherein the first selection unit outputs one of its inputs to data terminals of the one-bit registers based on the first selection signal; and
a second selection unit receiving an external clock signal as a first input, a clock signal based on the output of the OR-gate as a second input, and a second selection signal based on the output of the OR-gate, wherein the second selection unit outputs one of its inputs to clock terminals of the one-bit registers based on the second selection signal.

2. The data error correction circuit of claim 1, wherein the data error detection unit detects whether the data values are equal to each other when the output of the OR-gate is the first logical value.

3. The data error correction circuit of claim 1, wherein the value corresponds to a selected one of a result of a logical AND operation performed upon the all bits and a result of a logical OR operation performed upon the all bits.

4. The data error correction circuit of claim 1, wherein the logic gate is a logical OR-gate configured to perform a logical OR operation upon the all bits.

5. The data error correction circuit of claim 1, wherein the logic gate is a logical AND-gate configured to perform a logical AND operation upon the all bits.

6. The data error correction circuit of claim 1, further comprises:
a third logical AND-gate configured to perform a logical AND operation upon the all bits; and
a third selection circuit configured to select one of the output value of the logic gate and the output value of the third logical AND-gate, wherein the logic gate is a second logical OR-gate.

7. The data error correction circuit of claim 6, wherein the third selection circuit selects one of the output value of the second logical OR-gate and the output value of the third logical AND-gate based upon an external event signal.

8. The data error correction circuit of claim 1, wherein the first selection unit outputs the value to the plurality of the registers if the all bits are not equal, and the external data value to the plurality of the registers if the all bits are equal.

9. The data error correction circuit of claim 1, wherein the output of the second selection unit provides a clock for indicating a time point when the value is stored if the all bits are not equals and the first selection unit provides the value if the all bits are not equal.

10. The error correction circuit of claim 1, wherein the data correction unit determines the correct data values based upon each of the stored data values and when an external event is received that is indicative of a user of a mobile communication device performing an action to the device.

11. An integrated circuit (IC), comprising:
an event detection circuit configured to detect an event generated from the exterior; and
a data error correction circuit configured to correct a data error if the event is detected, the data error correction circuit comprising:
a plurality of one-bit registers;
a data error detection unit configured to detect whether data values respectively stored in the plurality of the registers are equal to each other,
wherein the error detection unit is configured to output a first logical value when all the data values are equal to each other and output a second logical value when the data values are not all equal to each other,
wherein the first logical value is different from the second logical value; and
a data correction unit configured to determine correct data values based upon each of the stored data values if the event is detected, and to correct each of the data values into the determined correct data value to store the corrected data values into the registers, respectively, when the output of the error detection unit is the second value,
wherein the data correction unit comprises:
a selection unit receiving an external clock signal as a first input, a clock signal based on an output of the data error detection unit as a second input, and a selection signal based on the output of the data error detection unit, wherein the selection unit outputs one of its inputs to clock terminals of the one-bit registers based on the selection signal.

12. The IC of claim 11, wherein the data error detection unit detects whether the data values are equal to each other based upon a logical AND value of the data values and a logical AND value of inverted data values the inverted data values being obtained by inverting the data values.

13. The IC of claim 11, wherein the data correction unit comprises:
a correct value determination unit configured to calculate the correct data value based upon the stored data values; and
a correct value selection unit configured to select one of the calculated correct data value and an external data value based upon the detected result of the data error detection unit, if the event is detected.

14. The IC of claim 13, wherein the correct value selection unit selects one of the result of a logical AND operation performed upon the data values and the result of a logical OR operation performed upon the data values if the event is detected.

15. The IC of claim 14, wherein the data error detection unit comprises:

a first AND-gate receiving each bit output by the one-bit registers;
a plurality of inverters receiving each bit output by the one-bit registers, wherein each inverter receives a corresponding one of the bits to generate inverted bits;
a second AND-gate receiving all of the inverted bits; and
an OR-gate receiving an output of the first AND-gate and an output of the second AND-gate,
wherein an output of the OR-gate is the first logical value when all of the bits output by the one-bit registers are the first logical value or the second logical value, and
wherein the output of the OR-gate is the second logical value when at least one of the bits output by the one-bit registers is the first logical value and at least one of the bits output by the one bit registers is the second logical value.

16. A method of performing data error correction, the method comprising:
checking for an event generated from the exterior; and
upon encountering the event,
detecting whether a plurality of data values stored in a plurality of one-bit registers are all equal to each other;
determining a correct data value based upon each of the stored data values; and
correcting each of the data values into the determined correct data value if the data values are not equal,
wherein detecting whether the data values are all equal to each other comprises:
performing a logical AND on all bits output by the registers to generate a first result;
performing a logical inversion on all of the bits to generated inverted bits;
performing a logical AND on all the inverted bits to generate a second result; and
performing a logical OR on the first result and the second result to generate a third result,
wherein the third result is a first logical value when the data values are all equal to each other,
wherein the third result is a second logical value when the data values are not all equal to each other, and
wherein the first logical value is different from the second logical value,
wherein the event is indicative of a user of a mobile communication device performing a physical action to the device.

17. The method of claim 16, wherein determining the correct data value comprises performing a logical OR operation upon the data values.

18. The method of claim 16, wherein determining the correct data value comprises performing a logical AND operation upon the data values.

19. The method of claim 16, wherein determining the correct data value comprises:
performing a logical OR operation upon the data values to output the logical OR operation result;
performing a logical AND operation upon the data values to output the logical AND operation result; and
selecting one of the logical OR operation result and the logical AND operation result based upon the event.

* * * * *